United States Patent [19]

Kodrnja et al.

[11] Patent Number: 5,510,755
[45] Date of Patent: Apr. 23, 1996

[54] TEMPERATURE STABLE VOLTAGE-CONTROLLED ELECTRONIC CAPACITANCE FOR AN OSCILLATOR

[75] Inventors: Marc Kodrnja; Vincent Dufossez, both of Grenoble, France

[73] Assignee: SGS-Thomson Microelectronics, S.A., Saint-Genis Pouilly, France

[21] Appl. No.: 365,465

[22] Filed: Dec. 28, 1994

[30] Foreign Application Priority Data

Dec. 30, 1993 [FR] France .................................. 93 16032

[51] Int. Cl.[6] .............................. H03B 5/00; H03H 11/48
[52] U.S. Cl. .................................. 331/177 R; 331/108 R; 333/214
[58] Field of Search .............................. 331/108 R, 111, 331/176, 177 R, 177 V, 36 C; 307/109; 330/7; 333/214

[56] References Cited

U.S. PATENT DOCUMENTS 3,702,405  11/1972  Zwirn et al. .............................. 307/109
4,638,265   1/1987  Lunn et al. .............................. 333/214
5,012,201   4/1991  Morita et al. ........................ 333/214 X
5,166,560  11/1992  Liu ......................................... 307/493

FOREIGN PATENT DOCUMENTS 0003515   1/1987   Japan .................................... 333/214

Primary Examiner—David Mis
Attorney, Agent, or Firm—David M. Driscoll; James H. Morris; John N. Anastasi

[57] ABSTRACT

A voltage-controlled capacitor includes a multiplier, having an output which serves as terminals of the controlled capacitor. The output voltage of the multiplier is applied to a reference capacitor. A signal in phase with the current in the reference capacitor is applied at one input of the multiplier, the other input of the multiplier receiving a signal determining the value of the controlled capacitor.

21 Claims, 2 Drawing Sheets

TEMPERATURE STABLE VOLTAGE-CONTROLLED ELECTRONIC CAPACITANCE FOR AN OSCILLATOR

BACKGROUND OF THE INVENTION

1. Field of the Invention

The present invention relates to voltage-controlled sine wave oscillators, and more particularly to a voltage-controlled capacitor used in such oscillators.

2. Discussion of the Related Art

FIG. 1 is a schematic of a conventional voltage-controlled sine wave oscillator 10 including a fixed capacitor Co coupled in parallel with a capacitor Cv whose value is fixed by a voltage Vc. The frequency of the oscillator is determined by the sum of the values of capacitors Co and Cv. Voltage Vc acts on both the value of capacitor Cv and the oscillator's frequency.

Generally, the capacitor Cv is a so-called "varicap" diode, the junction capacitance of which depends upon its bias voltage. However, such a variable capacitor has the drawback of being highly temperature-dependent.

PCT patent application WO 86/07508 describes a voltage-controlled capacitor formed with a circuit comprising two reference capacitors associated with two cross-coupled differential stages. The output voltage of each differential stage is applied to one terminal of the capacitor associated with the stage and the other terminal of the capacitor is connected to the emitters of transistors of the stage. To increase the limit operating frequency, compensation resistors are connected to cooperate with the reference capacitors. However, it is difficult to match a capacitor and a resistor in an integrated circuit, especially if the manufacturing technology of the integrated circuit is changed. Moreover, a capacitor and a resistor do not have the same temperature variation characteristics. As a result, the limit frequency of the controlled capacitor varies substantially as a function of the technology and of temperature.

SUMMARY OF THE INVENTION

An object of the present invention is to provide a variable capacitor having a high temperature stability for use at high frequencies.

According to the present invention, a voltage-controlled capacitor includes a multiplier having output terminal that serves as terminals of the controlled capacitor. The output voltage of the multiplier is applied on a reference capacitor. A signal in phase with the current across the reference capacitor is applied to one of the inputs of the multiplier. The second multiplier input receives a signal determining the value of the controlled capacitor.

According to an embodiment of the invention, the voltage-controlled capacitor includes two parallel differential pairs that are crossed controlled by a first differential signal. The two output branches of these differential pairs constitute the terminals of the controlled capacitor. Two biasing capacitors are connected to determine the respective bias currents of the two differential pairs as a function of a second differential signal. The respective voltages of the controlled capacitor terminals are applied to two respective reference capacitors. The respective currents in the reference capacitors are provided as a first or second differential signal. The emitters of two compensation transistors are connected together by a compensation capacitor and are connected in parallel by their collectors and their bases respectively to the two transistors of one of the differential pairs or to the two biasing transistors.

According to an embodiment of the present invention, a first terminal of each reference capacitor is connected to the associated multiplier output through an emitter-follower transistor, and the second terminal of each reference capacitor is connected to an associated input terminal. This input terminal is connected to a reference voltage through a diode biased by a current source.

The foregoing and other objects, features, aspects and advantages of the invention will become apparent from the following detailed description of the present invention when taken in conjunction with the accompanying drawings.

DETAILED DESCRIPTION

Figure 1:
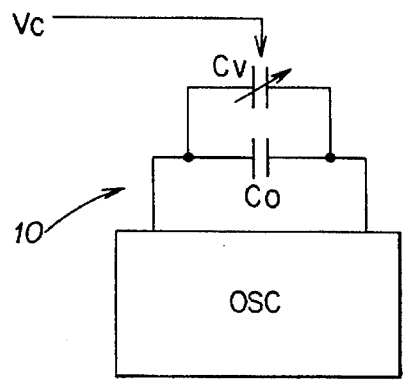
FIG. 1 is a schematic of a conventional voltage-controlled oscillator.
Figure 2:
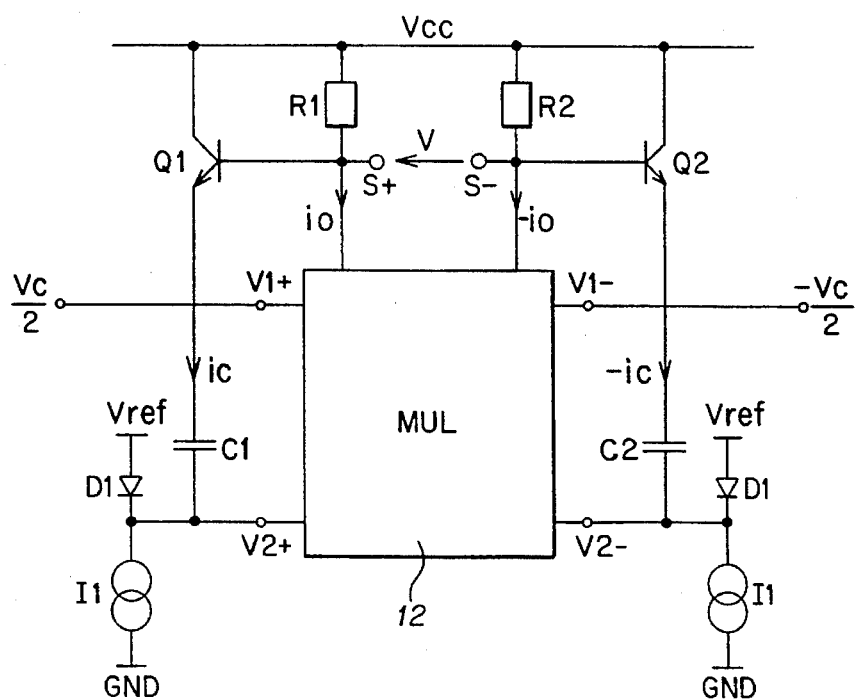
FIG. 2 is a schematic of an embodiment of a variable capacitor realized with a multiplying circuit.

FIG. 2 illustrates of a voltage-controlled capacitor having a multiplying circuit 12, such as a Gilbert multiplier. As disclosed in "Analysis and Design of Analog Integrated Circuits", third edition, P. R. Gray, R. G. Meyer, Edition John Wiley & Sons, Inc, incorporated herein by reference, a Gilbert multiplier has two differential inputs V1+/V1− and V2+/V2−, and a differential current output S+/S−. The output current is substantially proportional to the product of the two input voltages (V1 across terminals V1+ and V1−, and V2 across terminals V2+ and V2−) when these input voltages V1 and V2 vary near zero. Voltage Vc, which determines the value of the controlled capacitor, is applied between terminals V1+ and V1−.

Terminals S+ and S− are connected to a high supply voltage Vcc through respective resistors R1 and R2 of same value. The voltages on terminals S+ and S− are provided to the terminals of two capacitors C1 and C2, respectively, of same value, through NPN transistors Q1 and Q2 connected as emitter followers. The emitters of transistors Q1 and Q2 are connected to capacitors C1 and C2, the bases are connected to outputs S+ and S−, and the collectors are connected to voltage Vcc. The two remaining terminals of capacitors C1 and C2 are connected to the input terminals V2+ and V2−, respectively.

Terminals V2+ and V2− are connected to respective linearizing circuits, each of which includes a biased diode D1 connecting the input terminal to a constant reference voltage Vref and a current source I1 connecting the input terminal to a low voltage GND. Each diode D1 is constituted, for example, by an NPN transistor, whose base is connected to voltage Vref, the collector is connected to voltage Vcc, and the emitter is connected to the respective current source I1.

When an a.c. voltage V is applied across the output terminals S+ and S− of multiplier 12, an a.c. voltage V/2 appears on the emitter of transistor Q1, and an a.c. voltage −V/2 appears on the emitter of transistor Q2. voltages V/2 and −V/2 generate an a.c. current ic in capacitor C1 and an a.c. current −ic in capacitor C2. Because of linearizing circuits D1/I1, the a.c. components of the output currents of multiplier 12 (io at terminal S+ and −io at terminal S−) are proportional to currents ic and −ic. Thus, the currents in capacitors C1 and C2 are duplicated, with a multiplication factor, on terminals S+ and S−. As a result, the circuit behaves, between terminals S+ and S−, as a capacitor proportional to capacitors C1 and C2. In addition, the proportionality factor itself depends upon the control voltage Vc applied between terminals V1+ and V1−. More precisely, this proportionality factor varies according to a hyperbolic tangent of the control voltage Vc, between a lower limit −A and a higher limit A when the control voltage Vc approaches minus infinity and plus infinity, respectively. In practice, the limit −A or A is reached when the absolute value of voltage Vc is high with respect to 2kT/q, where k is the Boltzmann's constant, T is the absolute temperature, and q is the electron load. Constant A is determined by the structure of multiplier 12.

With the circuit of FIG. 2, a variable voltage-controlled capacitor, capable of having a zero value for a zero control voltage and even a negative value for a negative control voltage, is obtained. The control of an oscillator using this controlled capacitor is therefore simplified.

Furthermore, the values of the fixed reference capacitors C1 and C2 are advantageously very steady in temperature, more particularly in integrated technology, relating to the capacitance of a varicap diode.

Figure 3:
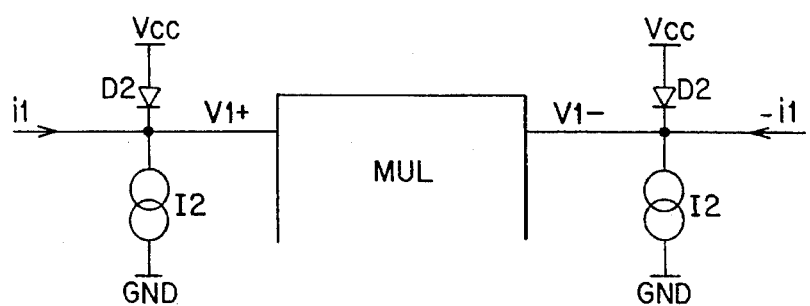
FIG. 3 is a schematic of a circuit providing, with the circuit of FIG. 2, a capacitance that is proportional to a control signal.

FIG. 3 illustrates an alternative embodiment to the circuit of FIG. 2 for providing a capacitance proportional to a control signal. For this purpose, input terminals V1+ and V1− are coupled to linearizing circuits including diodes D2 and current sources I2 in the same way that input terminals V2+ and V2− are coupled to linearizing circuits of FIG. 2. Diodes D2 are coupled to a voltage between Vref and Vcc, for example, voltage Vcc. With this configuration, the controlled capacitance is proportional to a differential control current i1, −i1 flowing between terminals V1+ and V1−.

The controlled capacitor of FIG. 2 can operate at relatively high frequencies. Various parasitic influences, such as the series resistances of capacitors C1 and C2, the base-emitter resistances of transistors Q1, Q2, and the phase shift induced by the transistors, limit the maximum operating frequency.

Figure 4A:
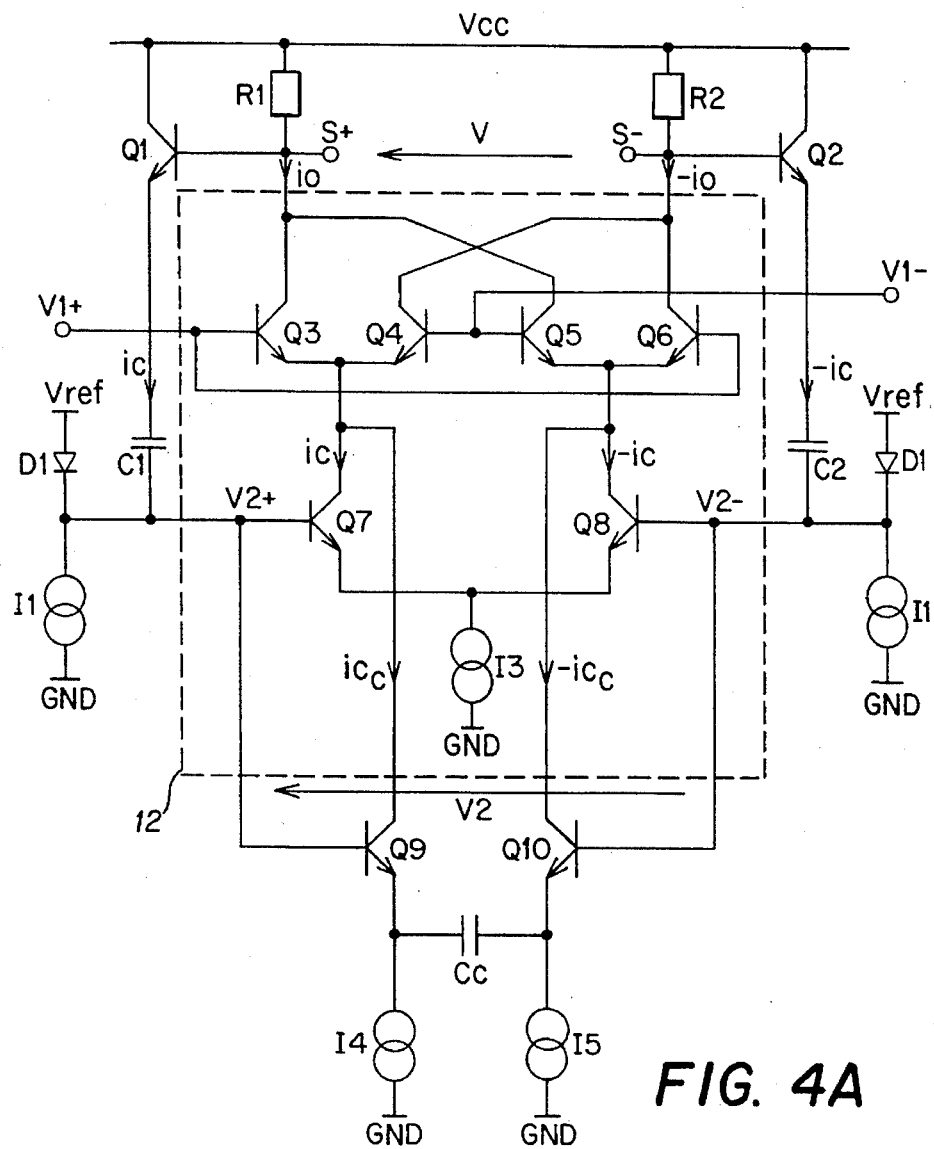
FIG. 4A is a schematic of a detailed embodiment of a variable capacitor including a multiplying circuit, the capacitor being with an embodiment of a compensation circuit according to the invention.

FIG. 4A illustrates in more detail the circuit of FIG. 2, associated with an embodiment of a compensation device according to the invention for increasing the limit operation frequency of the controlled capacitor. FIG. 4A more particularly represents a detailed embodiment of Gilbert multiplier 12. Multiplier 12 includes two differential pairs of NPN transistors Q3, Q4 and Q5, Q6, whose output branches are connected in parallel to the output terminals S+ and S−. The differential pairs Q3/Q4 and Q5/Q6 are cross-controlled through the input terminals V1+ and V1−; i.e., terminal V1+ controls, in the first differential pair, transistor Q3 connected to the output terminal S+ and, in the second differential pair, transistor Q6 connected to the output terminal S−. The input terminal V1− controls, in the first differential pair, transistor Q4 connected to the output terminal S− and, in the second differential pair, transistor Q5 connected to terminal S+.

The bias currents of the differential pairs Q3/Q4 and Q5/Q6 are fixed by the respective branches of a differential pair of NPN transistors Q7 and Q8. The base of transistor Q7 is controlled by the input terminal V2+ and the base of transistor Q8 is controlled by the input terminal V2−. The bias current of the differential pair Q7/Q8 is determined by a current source I3 connected to voltage GND.

With such a multiplier, the bias currents of the differential pairs Q3/Q4 and Q5/Q6 are determined by voltage V2 across terminals V2+ and V2−. The differential pairs Q3/Q4 and Q5/Q6 amplify the voltage across terminals V1+ and V1−, but the amplification ratio depends upon the bias currents of these two differential pairs. As a result, a multiplying effect is achieved between the voltages present at terminals. V1+, V1− and at terminals V2+, V2−. A more detailed description of the operation of multiplier 12 can be found in any work describing Gilbert multipliers.

Of course, the functions of the two multiplying inputs (V1+/V1− and V2+/V2−) can be inverted. Capacitors C1 and C2, as well as the linearizing circuits D1/I1, are then connected to terminals V1+ and V1−, the control voltage Vc being applied across terminals V2+ and V2−. However, the common mode voltage at input V1+/V1− must be higher than the common mode voltage at input V2+/V2−.

According to the present invention, a compensation system, described hereinafter, allows the controlled capacitor of FIG. 4A to operate at particularly high frequencies, for example, at approximately 40 MHz with usual fabrication technologies. This compensation system includes, in the example of FIG. 4A, an NPN transistor Q9, connected in parallel by its collector and by its base to transistor Q7, and an NPN transistor Q10, connected in parallel by its collector and by its base to transistor Q8. The emitters of transistors Q9 and Q10 are connected to each other through a compensation capacitor Cc and to voltage GND through current supply sources I4 and I5, respectively.

Figure 4B:
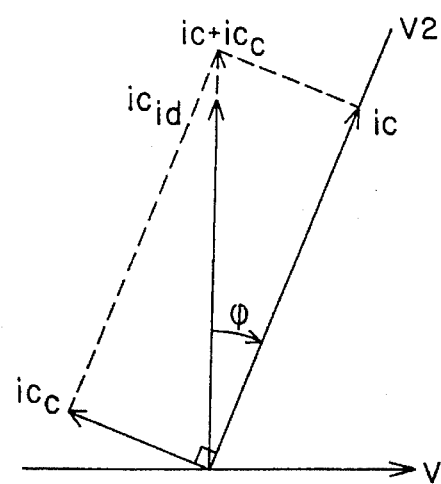
FIG. 4B is a phase diagram illustrating the operation of the compensation circuit of FIG. 4A.

FIG. 4B is a phase shift diagram illustrating the operation of the compensation system of FIG. 4A. When an a.c. voltage V is applied, as indicated above, across the multiplier output terminals S+ and S−, a current ic appears in capacitor C1 and a current −ic appears in capacitor C2. The linearizing circuits D1/I1 associated with transistors Q7 and Q8 operate so that the currents ic and −ic are added to the quiescent currents of the collectors of transistors Q7 and Q8. Current ic and the voltage V2 across terminals V2+ and V2− are in phase, as represented in the diagram of FIG. 4B. However, the effective current ic is shifted by a value $\phi$ with respect to the ideal current $ic_{id}$ due to parasitic influences. This phase shift $\phi$ increases with the operation frequency of the controlled capacitor and prevents correct operation beyond a determined frequency.

With the correction device according to the invention, a.c. voltage V2 is applied across the compensation capacitor Cc through transistors Q9 and Q10, thus generating in capacitor Cc a current $ic_c$ shifted by 90° with respect to current ic and voltage V2. Transistors Q9 and Q10 add, through their collectors, a current $ic_c$ to the collector current of transistor Q7 and a current $-ic_c$ to the collector current of transistor Q8. Thus, the useful currents, that is, the a.c. components of the bias currents of the differential pairs Q3/Q4 and Q5/Q6, are established at values $ic+ic_c$ and $-ic-ic_c$ having a phase very close to the phase of the ideal current ic. The amplitude of current $ic_c$ is determined by the value of capacitor Cc. Thus, to obtain an optimal compensation, that is, a current $ic+ic_c$ in phase with the ideal current ic, the value of capacitor Cc is chosen, if required by trial, as a function of the nominal operation frequency of the controlled capacitor.

If the functions of the two inputs V1+/V1− and V2+/V2− are inverted, the compensation transistor Q9 is connected in parallel through its base and its collector to one of transistors Q3 and Q6, and the compensation transistor Q10 is connected in parallel by its base and its collector to one of transistors Q5 and Q6.

The compensation device according to the invention has been described with reference to a Gilbert multiplier, but such a device applies to any multiplying system in which one amplifying stage of a first signal to multiply is biased by a current determined by a second signal to multiply.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A voltage-controlled capacitor including:

two parallel differential pairs of transistors cross-controlled by a first differential signal, respective output branches of said two differential pairs constituting terminals of the voltage controlled capacitor;

two biasing transistors that determine respective bias currents of the two differential pairs of transistors as a function of a second differential signal;

two reference capacitors;

means for applying a voltage present at each of the controlled capacitor terminals to a respective one of the two reference capacitors;

means for providing, as said second differential signal, a current in each one of the two reference capacitors;

a compensation capacitor; and two compensation transistors having first main electrodes connected together by the compensation capacitor and being connected in parallel between their first main electrode, their second main electrodes and their control electrodes, the two compensation transistors being coupled to the differential pairs of transistors and to the biasing transistors.

2. The voltage-controlled capacitor of claim 1, wherein a first terminal of each reference capacitor is connected to an output branch of a respective differential pair of transistors through an emitter-follower transistor, and wherein a second terminal of each reference capacitor is connected to a control terminal of the respective biasing transistor, the control terminal of each biasing transistor being connected to a reference voltage through a diode biased by a current source.

3. The voltage-controlled capacitor of claim 1, wherein the biasing transistors are connected as a differential pair.

4. A voltage-controlled capacitor including:

a multiplier having two differential transistor pairs cross-controlled by a differential control signal, and first and second biasing transistors, each biasing transistor being coupled to a respective differential transistor pair, each biasing transistor having a control lead for receiving a differential reference signal, the multiplier providing an output voltage signal derived from a product of the differential control signal and the differential reference signal;

first and second capacitors, each capacitor having a first terminal and a second terminal;

means for providing to the first terminal of the first and second capacitors a respective first and second voltage signal, the first and second voltage signals being derived from the output voltage signal of the multiplier;

means for providing a first signal in phase with a current in the first capacitor to the control lead of the first biasing transistor;

means for providing a second signal in phase with a current in the second capacitor to the control lead of the second biasing transistor; and wherein the output voltage signal of the multiplier simulates electrical characteristics of a capacitor having a capacitance that is derived at least in part from the differential control signal and from the first and second voltage signal across the first and second capacitor.

5. The voltage-controlled capacitor of claim 4, wherein the multiplier is a Gilbert multiplier.

6. The voltage controlled capacitor of claim 4, further comprising:

a compensation capacitor having first and second terminals; and two compensation transistors, each compensation transistor having a first electrode, a second electrode, and a control lead;

wherein the first electrode of one of the two compensation transistors is coupled to the first terminal of the compensation capacitor and the first electrode of another of the two compensation transistors is coupled to the second terminal of the compensation capacitor, wherein the control lead of each of the two compensation transistors is coupled to the control lead of a respective biasing transistor, and wherein the second electrodes are coupled to an electrode of the respective differential transistor pair.

7. The voltage-controlled capacitor of claim 4, wherein each means for providing the first and second voltage signal includes a respective follower transistor in a follower configuration, wherein each output lead of the multiplier is electrically coupled to a control terminal of the respective follower transistor.

8. The voltage-controlled capacitor of claim 4, further including two voltage sources, two current sources, and two diodes, each diode having an anode coupled to a respective voltage source and a cathode coupled to a respective current source, wherein the second terminal of each of the first and second capacitors is coupled to the control lead of one of the first and second biasing transistors.

9. The voltage controlled capacitor of claim 8, further comprising:

a compensation capacitor having first and second terminals; and two compensation transistors, each compensation transistor having a first electrode, a second electrode, and a control lead;

wherein the first electrode of one of the two compensation transistors is coupled to the first terminal of the compensation capacitor and the first electrode of another of the two compensation transistors is coupled to the second terminal of the compensation capacitor, wherein the control lead of each of the two compensation transistors is coupled to the control lead of a respective biasing transistor, and wherein the second electrodes are coupled to an electrode of the respective differential transistor pair.

10. An oscillator assembly comprising:

an oscillator; and a voltage controlled capacitor coupled to the oscillator and including:

a multiplier having two differential transistor pairs cross-controlled by a differential control signal, and first and second biasing transistors, each biasing transistor being coupled to a respective differential transistor pair, each biasing transistor having a control lead for receiving a differential reference signal, the multiplier providing an output voltage signal derived from a product of the differential control signal and the differential reference signal;

first and second capacitors, each capacitor having a first terminal and a second terminal;

means for providing to the first terminal of the first and second capacitors a respective first and a second voltage signal, the first and second voltage signals being derived from the output voltage signal of the multiplier;

means for providing a first signal in phase with a current in the first capacitor to the control lead of the first biasing transistor;

means for providing a second signal in phase with a current in the second capacitor to the control lead of the second biasing transistor; and wherein the output voltage signal of the multiplier simulates electrical characteristics of a capacitor having a capacitance that is derived at least in part from the differential control signal and from the first and second voltage signal across the first and second capacitor.

11. The oscillator assembly of claim 10, wherein the output voltage signal of the multiplier is provided to first and second terminals of the voltage controlled capacitor, and the oscillator assembly further comprises a fixed capacitance capacitor having first and second terminals, wherein the first and second terminals of the fixed capacitance capacitor are respectively coupled to the first and second terminals of the voltage-controlled capacitor.

12. The oscillator assembly of claim 10, wherein the multiplier is a Gilbert multiplier.

13. The oscillator assembly of claim 10, further comprising:

a compensation capacitor having first and second terminals; and first and second compensation transistors, each compensation transistor having a first electrode, a second electrode, and a control lead;

wherein the first electrode of the first compensation transistor is coupled to the first terminal of the compensation capacitor and the first electrode of the second compensation transistor is coupled to the second terminal of the compensation capacitor, wherein the control lead of the first and second compensation transistors is coupled to the control lead of a respective biasing transistor, and wherein the second electrode of the first and second compensation transistor is coupled to an electrode of the respective differential transistor pair.

14. The oscillator assembly of claim 11, wherein each means for providing the first and second voltage signal includes a respective follower transistor in a follower configuration, wherein each output lead of the multiplier is electrically coupled to a control terminal of the respective follower transistor.

15. The oscillator assembly of claim 11, further including two voltage sources, two current sources, and two diodes, each diode having an anode coupled to a respective voltage source and a cathode coupled to a respective current source, wherein the second terminal of each of the first and second capacitors is coupled to the control lead of one of the first and second biasing transistors.

16. The oscillator assembly of claim 15, further comprising:

a compensation capacitor having first and second terminals; and two compensation transistors, each compensation transistor having a first electrode, a second electrode, and a control lead;

wherein one of the first electrodes is coupled to the first terminal of the compensation capacitor and the other of the first electrodes is coupled to the second terminal of the compensation capacitor, wherein the control leads are each coupled to a control lead of a respective biasing transistor, and wherein the second electrodes are coupled in parallel to an electrode of a respective differential transistor pair.

17. A voltage controlled capacitance having a first terminal and a second terminal, the voltage controlled capacitance comprising:

a multiplier circuit having first and second pairs of differential voltage input terminals and first and second differential current output terminals, wherein the first and second differential voltage input terminals receive respective first and second differential voltage input signals, wherein a differential current output signal of the multiplier circuit is substantially proportional to a product of the first and second differential voltage input signals, wherein the first terminal of the voltage controlled capacitance is coupled to the first differential current output terminal and the second terminal of the voltage controlled capacitance is connected to the second current output terminal;

first and second resistors, the first resistor being connected between a supply voltage and the first differential current output terminal, the second resistor being connected between the supply voltage and the second differential current output terminal;

first and second linearizing circuits, the first linearizing circuit being connected to a first differential voltage input terminal of the second pair of differential voltage input terminals, the second linearizing circuit being connected to a second differential voltage input terminal of the second pair of differential voltage input terminals; and first and second reference capacitors, the first reference capacitor being coupled between the supply voltage and the first differential voltage input terminal of the second pair of differential voltage input terminals, the second reference capacitor being coupled between the supply voltage and the second differential voltage input terminal of the second pair of differential voltage input.

18. The voltage controlled capacitance of claim 17, wherein the first and second linearizing circuits each include a diode connected between a constant reference voltage and a constant current source, the first differential voltage input terminal for the second pair of differential voltage input terminals being connected between the diode and the constant current source of the first linearizing circuit, and the second differential voltage input terminal for the second pair of differential voltage input terminals being connected between the diode and the constant current source of the second linearizing circuit.

19. The voltage controlled capacitance of claim 17, wherein the first and second linearizing circuits each include a transistor connected between a constant reference voltage and a constant current source, a base of the transistor being connected to the constant reference voltage, a collector of the transistor being connected to the supply voltage, and the emitter of the transistor being connected to the constant current source, wherein the first differential voltage input terminal for the second pair of differential voltage input terminals is connected between the emitter of the transistor and the constant current source of the first linearizing circuit, and the second differential voltage input terminal for the second pair of differential voltage input terminals is connected between the emitter of the transistor and the constant current source of the second linearizing circuit.

20. The voltage controlled capacitance of claim 17, further including:

a first transistor, a collector of the first transistor being connected to the supply voltage, a base of the first transistor being connected to the first differential current output terminal, an emitter of the first transistor being connected to a first terminal of the first reference capacitor, and a second terminal of the first reference capacitor being connected to the first differential voltage input terminal for the second pair of differential voltage input terminals; and a second transistor, a collector of the second transistor being connected to the supply voltage, a base of the second transistor being connected to the second differential current output terminal, an emitter of the second transistor being connected to a first terminal of the second reference capacitor, and a second terminal of the second reference capacitor being connected to the second differential voltage input terminal for the second pair of differential voltage input terminals.

21. The voltage controlled capacitance of claim 17, wherein the multiplier circuit is a Gilbert multiplier.

* * * * *